United States Patent
Asano et al.

(10) Patent No.: US 7,339,210 B2
(45) Date of Patent: Mar. 4, 2008

(54) COMPOUND SEMICONDUCTOR SWITCHING CIRCUIT DEVICE

(75) Inventors: Tetsuro Asano, Gunma (JP); Mikito Sakakibara, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 183 days.

(21) Appl. No.: 11/314,804

(22) Filed: Dec. 22, 2005

(65) Prior Publication Data

US 2006/0163609 A1 Jul. 27, 2006

(30) Foreign Application Priority Data

Dec. 22, 2004 (JP) .............................. 2004-371831

(51) Int. Cl.
*H01L 27/10* (2006.01)

(52) U.S. Cl. ...................... 257/208; 257/203; 257/206; 257/207; 257/E29.006; 327/432

(58) Field of Classification Search ................ 257/203, 257/206, 207, 208, 192, E29.006; 327/432
See application file for complete search history.

(56) References Cited

FOREIGN PATENT DOCUMENTS

JP A-2002-368194 12/2002
KR 2002-93613 12/2002

*Primary Examiner*—Evan Pert
*Assistant Examiner*—Tan Tran
(74) *Attorney, Agent, or Firm*—Morrison & Foerster LLP

(57) ABSTRACT

High resistance elements of 5 KΩ or more are connected near first and second control terminals between the first and second control terminals and respective crossing portion of first and second connectings. Even when a high frequency analog signal transmitted in a pad wire leaks to the first and second connectings, the high frequency analog signal is attenuated by the high resistance elements. Accordingly, the high frequency analog signal is not substantially transmitted to control terminal pads. It is therefore possible to suppress an increase in insertion loss.

13 Claims, 10 Drawing Sheets

Prior Art

Prior Art

Prior Art

COMPOUND SEMICONDUCTOR SWITCHING CIRCUIT DEVICE

BACKGROUND OF THE INVENTION

The present invention relates to a compound semiconductor switching circuit device, and specifically, relates to a compound semiconductor switching circuit device with insertion loss reduced.

Mobile communication equipment such as cellular phones often uses microwaves in the GHz range and includes switching devices to switch high frequency signals in circuits to switch antennas, transmitting and receiving, and the like in many cases. For the switching devices, a field-effect transistor (hereinafter, referred to as an FET) using gallium arsenide (GaAs) is used in many cases because the mobile communication equipment deals with high frequencies. Accordingly, a monolithic microwave integrated circuit (MMIC) in which the above switching circuits are integrated is being developed.

FIG. 9A shows a principle circuit diagram of a compound semiconductor switching circuit device which is called a single pole double throw (SPDT) and uses GaAs FETs.

In this compound semiconductor switching circuit device, sources (or drains) of a first FET FET1 and a second FET FET2 are connected to a common input terminal IN, and gates of the FETs 1 and 2 are connected to first and second control terminals Ctl1 and Ctl2 through resistors R1 and R2, respectively. Moreover, drains (sources) of the FET1 and FET2 are connected to first and second output terminals OUT1 and OUT2, respectively.

Signals applied to the first and second control terminals Ctl1 and Ctl2 are complementary signals. One of the FETs to which an H level signal is applied is turned on and transmits to one of the output terminals a high frequency analog signal inputted to the input terminal IN. The resistors R1 and R2 are disposed for the purpose of preventing the high frequency signal from leaking through the gate electrodes to DC potential of the first and second control terminals Ctl1 and Ctl2, which are AC grounded. In logic of this switching circuit, for transmitting a signal to the first output terminal OUT1, for example, 3V is applied to the first control terminal Ctl1, which is closer to the first output terminal OUT1, and 0V is applied to the second control terminal Ctl2. On the contrary, for transmitting a signal to the second output terminal OUT2, a bias signal of 3V is applied to the second control terminal Ctl2, which is closer to the second output terminal OUT2, and a bias signal of 0V is applied to the first control terminal Ctl1.

However, in some requests from users, it is necessary to build reverse logic. Specifically, in such a reverse logic, as shown in FIG. 9B, for transmitting a signal to the first output terminal OUT1, for example, 3V is applied to the first control terminal Ctl1, which is more distant from the first output terminal OUT1, and 0V is applied to the second control terminal Ctl2. On the contrary, for transmitting a signal to the second output terminal OUT2, a bias signal of 3V is applied to the second control terminal Ctl2, which is more distant from the second output terminal OUT2, and a bias signal of 0V is applied to the first control terminal Ctl1. Hereinafter, the switching circuit device having the above reverse logic is referred to as a reverse control type switching circuit device.

FIG. 10 shows an example of a compound semiconductor chip in which the switching circuit of FIG. 9B is integrated.

The FET1 and FET2 for switching are disposed in the center of a GaAs substrate. The gate electrodes of the FET1 and FET2 are connected to the resistors R1 and R2, respectively. In the periphery of the substrate, pads I, O1, O2, C1, and C2, which serve as the common input terminal IN, first and second output terminals OUT1 and OUT2, and first and second control terminals Ctl1 and Ctl2, respectively, are provided around the FET1 and FET2. Wires indicated by dotted lines are formed of a gate metal layer (Ti/Pt/Au) 220 simultaneously with the formation of gate electrodes 217 of the FETs, and wires indicated by solid lines are formed of a pad metal layer (Ti/Pt/Au) 230 which connects the elements to each other and forms the pads. The pad metal layer 230 forms source electrodes 215 and drain electrodes 216, as a second metal layer of each electrode, and the like. Under the pad metal layer 230, source electrodes and drain electrodes, as a first metal layer of each electrode, and the like are formed of an ohmic metal layer (AuGe/Ni/Au), which are overlapped by the pad metal layer and therefore is not shown in FIG. 10.

The gate electrodes of the FET1 are connected to the first control terminal pad C1, which is more distant from the FET1, through the resistor R1. The gate electrodes of the FET2 are connected to the second control terminal pad C2, which is more distant from the FET2, through the resistor R2. The resistors R1 and R2 are disposed under a pad wiring 330 with a nitride film interposed therebetween. The pad wiring 330 is formed of the pad metal layer 230 and extended from the common input terminal pad I. The technology is described for instance in the Japanese Patent Application publication No. 2002-368164.

As described above, in the reverse control type switching circuit device, it is necessary to connect the first and second control terminal pads C1 and C2 to the gate electrodes of the FET1 and FET2, which are located at farther positions, by extending the resistors R1 and R2 in the chip. At this time, the resistors R1 and R2 are disposed between the common input terminal pad I and the FET1 and FET2 to prevent an increase in chip area due to extending of the resistors R1 and R2.

FIG. 11 is a cross-sectional view along a line i-i of FIG. 10.

As shown in the drawing, the resistors R1 and R2 between the common input terminal pad I and the FET1 and FET2 are doped regions obtained by doping, for example, a high concentration n type impurity into a substrate 211. On the surface of the substrate 211, a nitride film 260 is provided over the resistors R1 and R2, and on the nitride film 260, the pad metal layer 230 forming the common input terminal pad I is extended to provide the pad wiring 330. The pad wiring 330 is extended to the FET1 and FET2 and forms the source and drain electrodes as the second metal layer of each electrode. Under and around the common input terminal pad I, a high concentration peripheral impurity region 350 is provided to increase isolation.

The high frequency analog signal inputted to the common input terminal IN of the switching circuit device is transmitted in the pad wiring 30 and reaches the source (or drain) electrodes of the FET1 and FET2. At this time, however, there is a problem that part of the high frequency signal transmitted in the pad wiring 30 leaks through the nitride film 260 to the resistors R1 and R2 under the nitride film 260.

The resistors R1 and R2 are connected to the first and second control terminal pads C1 and C2, respectively. That is, when the high frequency signal leaks to the resistors R1 and R2, the high frequency signal reaches the control terminals, each of which is at GND potential at high frequencies, thus increasing an insertion loss between the common input terminal IN and the first output terminal OUT1 (or second output terminal OUT2) of the switching circuit device.

SUMMARY OF THE INVENTION

The present invention provides a compound semiconductor switching circuit device that includes two or more switching elements formed on a compound semiconductor substrate, each of the switching elements comprising at least one gate, a signal input portion and a signal output portion, a common input terminal pad formed on the substrate and connected with the signal input portions of the switching elements, an output terminal pad provided for each of the switching elements and connected with a corresponding signal output portion, the output terminals pads being formed on the substrate, a control terminal pad provided for each of the switching elements and connected with a corresponding gate, the control terminal pads being formed on the substrate, a connection wiring formed on the substrate and connecting the common input terminal pad and one of the signal input portions, and a connecting path connecting one of the control terminal pads and a corresponding gate, wherein the connecting path intersects the connection wiring and comprises a high resistance element that has a resistance higher than an average resistance of the connecting path and is disposed between the control terminal pad with which the connecting path is connected and the intersection between the connecting path and the connection wiring.

The present invention also provides a compound semiconductor switching circuit device that includes a first switching element and a second switching element that are formed on a compound semiconductor substrate, each of the first and second switching elements comprising at least one gate, a signal input portion and a signal output portion, a common input terminal pad formed on the substrate and connected with the signal input portions of the switching elements, a first output terminal pad formed on the substrate and connected with the signal output portion of the first switching element, a second output terminal pad formed on the substrate and connected with the signal output portion of the second switching element, a first control terminal pad formed on the substrate and connected with the gate of the first switching element, a second control terminal pad formed on the substrate and connected with the gate of the second switching element, a connection wiring formed on the substrate and connecting the common input terminal pad and the signal input portions of the first and second switching elements, a first connecting path connecting the first control terminal pad and the gate of the first switching element; and a second connecting path connecting the second control terminal pad and the gate of the second switching element, wherein each of the first and second connecting paths intersects the connection wiring and comprises a high resistance element that has a sheet resistance higher than a sheet resistance of a corresponding connecting path located at the intersection between the connection wiring and the first and second connecting paths and is disposed between a corresponding control terminal pad and the intersection between the connection wiring and the first and second connecting paths.

BRIEF DESCRIPTION OF THE INVENTION

DETAILED DESCRIPTION OF THE PREFERRED EMBODIMENTS

A description will be given of embodiments of the present invention in detail with reference to FIGS. 1 to 8C.

First, with reference to FIGS. 1 to 3B, a description will be given of a first embodiment taking as an example a switching circuit device for high-power use including a plurality of FETs connected in series.

Figure 1:
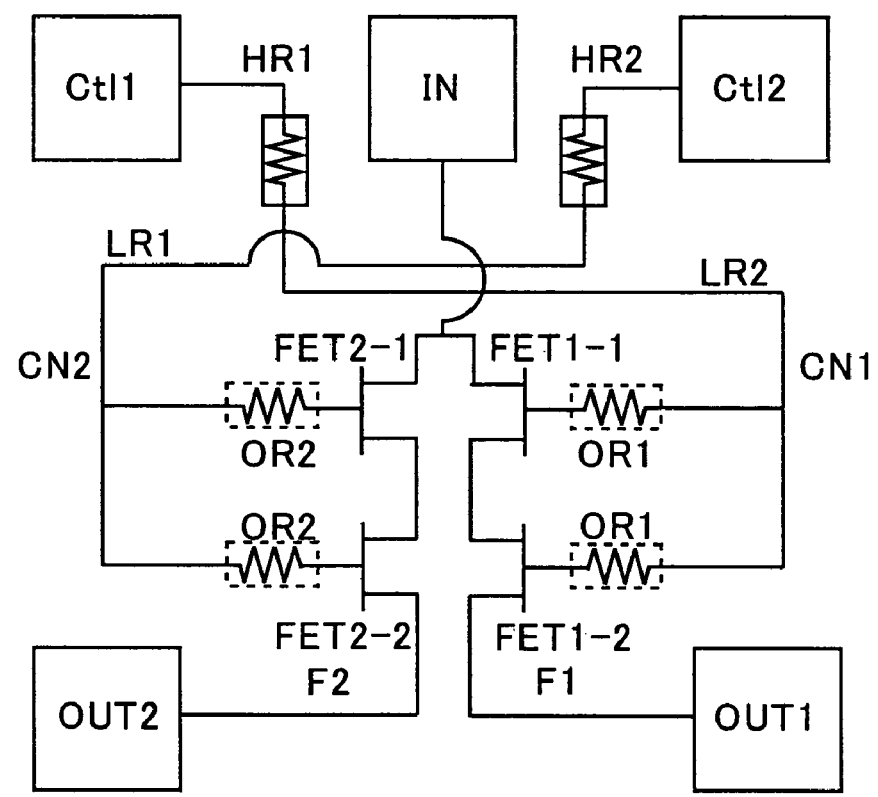
FIG. 1 is a circuit diagram for explaining a first embodiment of the present invention.

FIG. 1 is a circuit diagram showing an example of a multistage compound semiconductor switching circuit device. This switching circuit device is called an SPDT and includes five external terminals which are a common input terminal IN, first and second output terminals OUT1 and OUT2, and first and second control terminals Ctl1 and Ctl2.

As shown in the FIG. 1, the switching circuit device includes first and second switching elements F1 and F2. The first and second switching elements F1 and F2 are first and second FET groups F1 and F2, each of which includes, for example, two FETs connected in series. A source electrode (or a drain electrode) of FET1-1 of the first FET group F1 and a source electrode (or a drain electrode) of FET2-1 of the second FET group F2 are connected to the common input terminal IN. Gate electrodes of two FETs of the first FET group F1 are connected to the first control terminal Ctl1 through a first connecting path CN1, and gate electrodes of two FETs of the second FET group F2 are connected to the second control terminal Ctl2 through a second connecting path CN2.

Furthermore, a drain electrode (or a source electrode) of FET 1-2 of the first FET group F1 is connected to the first output terminal OUT1, and a drain electrode (or a source electrode) of FET 2-2 of the second FET group F2 is connected to the second output terminal OUT2.

Control signals applied to the first and second control terminals Ctl1 and Ctl2 are complementary signals. The FET group to which an H-level signal is applied is turned on and transmits an input signal applied to the common input terminal IN to any one of the output terminals. The first and second connecting paths CN1 and CN2 individually include resistors. The resistors are disposed for the purpose of preventing leakage of the high frequency signal through the gate electrodes and the like to DC potential of the first and second control terminals Ctl1 and Ctl2, which are AC grounded.

The switching circuit device of the FIG. 1 has reverse control type logic. Specifically, in this logic, for transmitting a signal to the first output terminal OUT1, for example, 3 V is applied to the first control terminal Ctl1, which is distant from the output terminal OUT1, and 0 V is applied to the second control terminal Ctl2. On the contrary, for transmitting a signal to the second output terminal OUT2, a bias signal of 3 V is applied to the second control terminal Ctl2, which is distant from the second output terminal OUT2, and a bias signal of 0 V is applied to the first control terminal Ctl1.

Figure 2A:
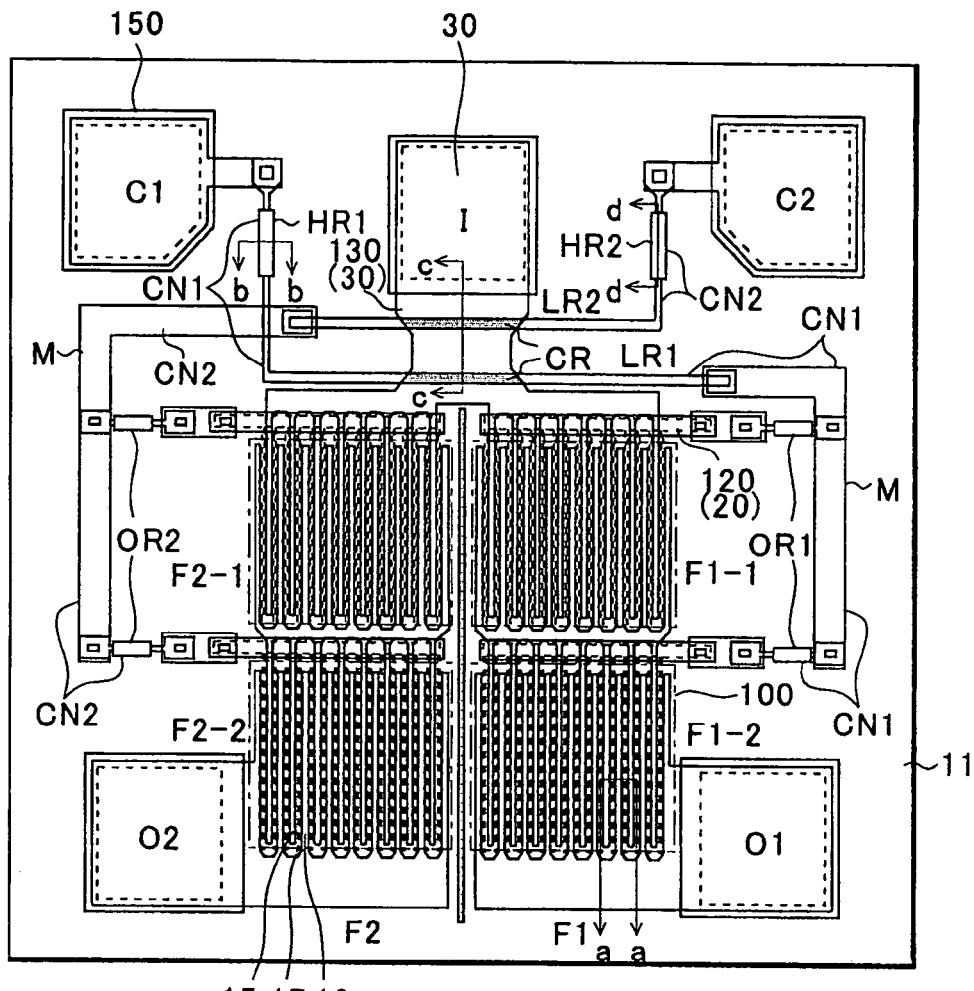
FIGS. 2A and 2B are a plan view and a cross-sectional view for explaining the first embodiment of the present invention, respectively.
Figure 2B:
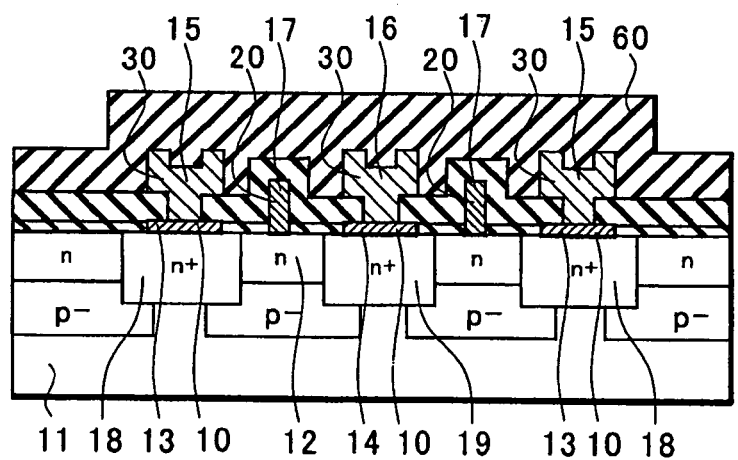

FIGS. 2A and 2B show an example of a compound semiconductor chip in which this compound semiconductor switching circuit device is integrated. FIG. 2A is a plan view, and FIG. 2B is a cross-sectional view of an operating region taken along a line a-a.

The two FET groups (the first and second FET groups F1 and F2) for switching are disposed in a GaAs substrate 11. The first FET group F1 includes, for example, FET1-1 and FET1-2 connected in series. The second FET group F2 includes FET2-1 and FET2-2 connected in series. In the periphery of the substrate 11, pads I, O1, O2, C1, and C2, which are connected to the common input terminal IN, output terminals OUT1 and OUT2, and control terminals Ctl1 and Ctl2, respectively, are provided. On the surface of the substrate 11 under and around each of the pads, a high concentration peripheral impurity region 150 is disposed to increase isolation.

A second metal layer indicated by dotted lines is a gate metal layer (Pt/Mo) 20 formed simultaneously with formation of gate electrodes of the FETs. A third metal layer indicated by solid lines is a pad metal layer (Ti/Pt/Au) 30 for connecting path the elements and forming the pads. A first metal layer is an ohmic metal layer (AuGe/Ni/Au) ohmically connected to the substrate 11. The ohmic metal layer is overlapped by a pad metal layer 30 and is not shown in FIG. 2A.

Each of operating regions 100 is a rectangular region of the GaAs substrate 11 surrounded by a dot-dashed line, into which n-type impurity ions are implanted. In the operating region 100, source and drain regions composed of high concentration n-type impurity regions are selectively formed (see FIG. 2B).

The first and second FET groups F1 and F2 are arranged symmetrically with respect to the centerline of the chip and have a same constitution. The following description is then given of the first FET group F1.

In FET1-1, eight comb teeth of the pad metal layer 30 extending from the upper side are second source electrodes 15 (or second drain electrodes 16). The second source electrodes 15 (or the second drain electrodes 16) are connected to the common input terminal pad I. Under the second source electrodes 15, first source electrodes formed of the ohmic metal layer which are not shown are provided. Nine comb teeth which are formed of the pad metal layer 30 and extend from the lower side are the second drain electrodes 16 (or the second source electrodes 15) of FET1-1. Under the second drain electrodes 16, drain electrodes formed of the ohmic metal layer which are not shown are provided and ohmically connected to the respective drain regions of the operating region 100. The second source and drain electrodes 15 and 16 are arranged in a form of interdigitated comb teeth. Sixteen gate electrodes 17 formed of the gate metal layer 20 are arranged in a form of comb teeth. Each of the gate electrodes 17 is arranged between a pair of adjacent the second drain and source electrodes 15 and 16. Each of the gate electrodes 17 forms a Schottky junction with a part of the operating region 100 between the source and drain regions.

In FET 1-2, eight comb teeth of the pad metal layer 30 extending from the upper side are the second source electrodes 15 (or the second drain electrodes 16). Under the second source electrodes 15, source electrodes formed of the ohmic metal layer which are not shown are provided. Nine comb teeth which are formed of the pad metal layer 30 and extend from the lower side are the second drain electrodes 16 (or the second source electrodes 15) connected to the output terminal pad O1. Under the second drain electrodes 16, the first drain electrodes formed of the ohmic metal layer which are not shown are provided. The second source and drain electrodes 15 and 16 are arranged in a form of interdigitated comb teeth. The sixteen gate electrodes 17 formed of the gate metal layer 20 are arranged in a form of comb teeth. Each of the gate electrodes 17 is arranged between a pair of adjacent the second drain and source electrodes 15 and 16.

In FET 1-1, the gate electrodes 17 are joined to each other outside the operating region 100 with a gate wiring 120 formed of the gate metal layer 20 and connected to the control terminal pad C1, which is distant from the first FET group F1, through the first connecting path CN1. In FET 1-2, the gate electrodes 17 are similarly joined to each other with the gate wiring 120 and connected to the control terminal pad C2, which is distant from the second FET group F2, through the gate wiring 120 and the second connecting path CN2.

Each of the source and drain electrodes of each FET has an electrode structure including two layers of the ohmic metal layer and the pad metal layer 30. The second source and drain electrodes 15 and 16 of the second layer are formed of the pad metal layer 30. The second source and drain electrodes 15 and 16 are respectively joined to each other by the pad wiring 130 that is part of the pad metal layer 30 outside the operating region 100.

The second drain electrodes 16 of FET1-2 are connected to the first output terminal pad O1 extended from the pad wiring 130. The second source electrodes 15 of FET1-1 are connected to the common input terminal pad I extended from the pad wiring 130.

On the surface of the substrate 11 under and around the pads and around the gate wirings 120, the peripheral impurity regions 150, which are high concentration impurity regions, are disposed to increase the isolation. Each of the peripheral impurity regions 150 is directly connected to each pad and provided in the entire area under the pad (or in the periphery of the pad) so as to protrude from the pad. Moreover, the peripheral impurity regions 150 may be provided about 5 μm or less apart and around the respective pads and are respectively connected to the pads with the semi-insulating substrate 11 interposed therebetween in a state in which direct current are allowed to flow (hereinafter referred to as "DC connected"). The peripheral impurity regions 150 are similarly provided under or around the gate wirings 120 and are DC connected to the gate wirings 120 directly or through the semi-insulating substrate 11, respectively.

A description will be given of the FETs with reference to the cross-sectional view of FIG. 2B. In the GaAs substrate 11, n-type channel layer 12 is provided by ion implantation, and on both sides of the channel layer 12, high concentration n-type impurity regions forming source regions 18 and drain regions 19 are provided. The gate electrodes 17 form Schottky junctions with the channel layer 12. In the source and drain regions 18 and 19, first source electrodes 13 and first drain electrodes 14 formed of an ohmic metal layer 10, which is a first metal layer, are provided, respectively. Furthermore, as described above, the second source and drain electrodes 15 and 16 formed of the pad metal layer 30, which is the third metal layer, are provided on the respective first source and drain electrodes 13 and 14 for wiring of the elements and the like.

Figure 3A:
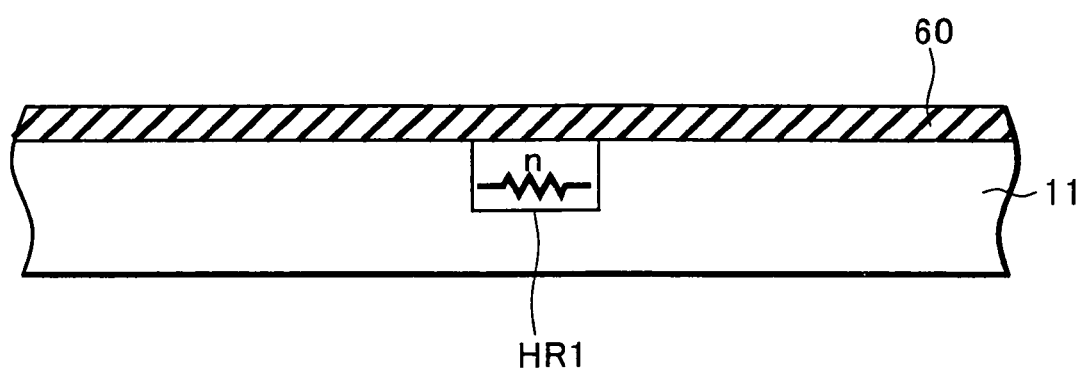
FIGS. 3A and 3B are cross-sectional views for explaining the first embodiment of the present invention.
Figure 3B:
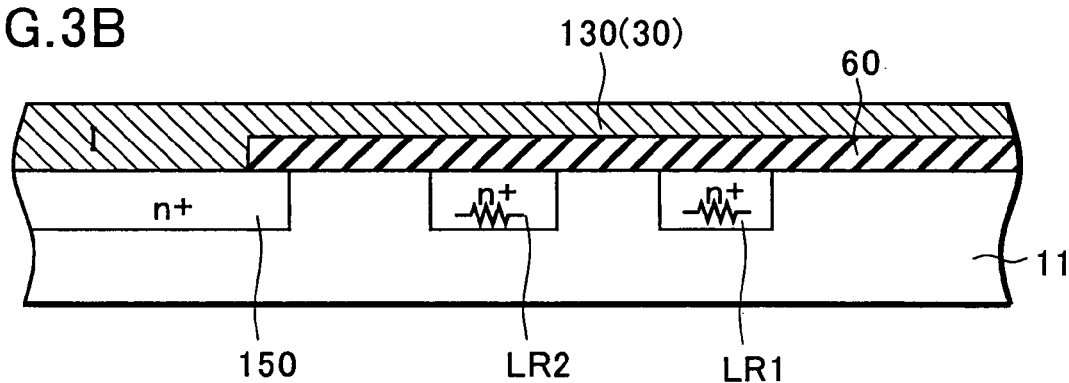

A description will be given with reference to again FIG. 2A and FIGS. 3A and 3B. FIGS. 3A and 3B are cross-sectional views taken along lines b-b and c-c of FIG. 2A, respectively.

The first connecting path CN1 includes a high resistance element HR1, a low resistance element LR1, a resistor OR1 and a wiring M connected with the resistor OR1 and composed of the pad metal layer 30. The first connecting path CN1 as a whole connects the gate electrodes 17 of the first FET group F1 and the first control terminal pad C1.

The second connecting path CN2 includes a high resistance element HR2, a low resistance element LR2, and a resistor OR2 connected to another wiring M composed of the pad metal layer 30 and connects the gate electrodes 17 of the second FET group F2 and the second control terminal pad C2. In the first embodiment, rectangles indicating the high resistance elements HR1 and HR2 on routes of the first and second connecting paths CN1 and CN2 in FIG. 2A have no meaning as patterns.

The high resistance element HR1 is an n-type impurity doped region with a comparatively low peak concentration ($2 \times 10^{17}$ to $4 \times 10^{17}$ cm$^{-3}$) which is almost equal to that of the channel layer 12 of the operating region 100. The sheet resistance of the high resistance element HR1 is about 1 k$\Omega$/$\square$, and the resistance thereof is 5 k$\Omega$ or more (for example, about 10 k$\Omega$). The high resistance element HR2 has the same structure (FIG. 3A). The impurity concentration of the ion implanted regions varies depending on depth and is represented by the peak concentration.

The low resistance element LR1 is an impurity region with comparatively high concentration (1 to $1.5 \times 10^{18}$ cm$^{-3}$) which is almost equal to that of the source and drain regions 18 and 19 of the operating regions 100. The sheet resistance of the low resistance element LR1 is about 100 $\Omega$/$\square$, and the resistance thereof is about 3 to 5 K$\Omega$. The low resistance element LR2 has the same structure.

Herein, the resistors OR1 are resistors similar to the high resistance element HR1 (the same applies to the resistors OR2). The resistors OR1 (OR2) are disposed for the purpose of preventing the leakage of the high frequency signal through the gate electrodes to the DC potential of the control terminal Ctl1 (Ctl2), which is AC grounded. Each of the resistors OR1 (OR2) may be formed by an impurity doped region having impurity concentration equal to that of the low resistance element LR1 so as to have a predetermined resistance. To eliminate the leakage of the high frequency signal from the gate electrodes 17, the high frequency signal from the gate electrodes 17 should be attenuated early. The resistors OR1 are therefore desirably connected near the gate electrodes 17.

Parts of the first and second connecting paths CN1 and CN2 are disposed in parallel between the common input terminal pad I and the first and second FET groups F1 and F2 and cross the pad wiring 130, which connects the common input terminal pad I and the first and second FET groups F1 and F2, with nitride film 60 interposed therebetween. The regions where the pad wiring 130 and the connecting paths cross each other are referred to as crossing portions CR in this specification. Specifically, the crossing portions CR are regions of the first and second connecting paths CN1 and CN2, as indicated by hatching of FIG. 2A, where the pad wiring 130 crosses the first and second connecting paths CN1 and CN2. The first and second connecting paths CN1 and CN2 of the crossing portions CR are composed of the low resistance elements LR1 and LR2, respectively (FIG. 3B).

The high resistance element HR1 of this embodiment is connected between the first control terminal pad C1 and the crossing portion CR of the first connecting path CN1. The high resistance element HR2 is connected between the second control terminal pad C2 and the crossing portion CR of the second connecting path CN2. The high resistance elements HR1 and HR2 are connected in series on routes of the first and second connecting paths CN1 and CN2 and constitute parts of the first and second connecting paths CN1 and CN2, respectively. The high resistance elements HR1 and HR2 are connected near the first and second control terminal pads C1 and C2, respectively, and specifically, connected to points 100 µm or less from the control terminal pads C1 and C2, respectively.

It is therefore possible to surely attenuate the high frequency signal leaking to the connecting paths including the low resistance element LR1 (LR2) connected to the high resistance element HR1 (hereinafter, the same applies to HR2) in series. Most of the leakage of the high frequency signal is leakage from the crossing portions CR in which the wiring crosses the connecting paths CN1 and CN2. However, in fact, the high frequency signal also leaks a little through the substrate 11 to the connecting paths CN1 and CN2 from the pad wirings 130 (the wirings or the electrodes), operating regions, and the like in which the high frequency signal is transmitted. For example, when a high frequency signal with high power of several watts is transmitted, the leakage component thereof cannot be ignored. Specifically, in the case where the high resistance element HR1 is connected far from the first control terminal pad C1 (the same applies to the second control terminal pad C2) and, for example, another low resistance element or the pad wiring 130 is connected between the high resistance element HR1 and the first control terminal pad C1 as a component of the first connecting path CN1, the high frequency signal leaks through the substrate 11 to the other low resistance element and the like from the pad wirings 130 (the wirings or the electrodes), the operating regions, and the like in which the high frequency signal is transmitted. The high frequency signal leaking is not attenuated and reaches to the first or second control terminal pads C1 and C2.

As shown in this embodiment, the high resistance element HR1 is therefore connected to a near point 100 µm or less from the control terminal pad C1. Even when the low resistance element LR1 to which the high frequency signal leaks is provided, therefore, the length of the low resistance element LR1 (distance from the high resistance element HR1 to the first control terminal pad C1) is made short, thus resulting in less chance of leakage of the high frequency signal. Moreover, the high resistance element HR1 is short and can be disposed in a space between the first control terminal pad C1 and the adjacent common input terminal pad I. Accordingly, there is no need for a particular space.

Specifically, when the first and second connecting paths CN1 and CN2, which connect the first and second control terminal pads C1 and C2 and the gate electrodes 17 of the switching MMIC, respectively and serve as control signal lines, cross the pad wiring 130 in which high frequency signal is transmitted, the high resistance elements HR1 and HR2 of 5 KΩ or more are connected in the vicinity of the respective control terminal pads C1 and C2 in the control signal lines. The control signal lines are configured to cross the pad wiring 130 in which the high frequency signal is transmitted between the high resistance elements HR1 and HR2 and the respective gate electrodes 17.

In such a layout, even when the high frequency analog signal leaks from the common input terminal pad I through the nitride film 60 to the first connecting path CN1 (the same applies to the second connecting path CN2), the signal leaking can be attenuated by the high resistance element HR1 (HR2) of about 5 KΩ or more. Moreover, the leaking high frequency signal actually does not reach the first control terminal pad C1 (second control terminal pad C2). The high frequency signal from the common input terminal pad I does not reach the first control terminal pad C1 (second control terminal pad C2), which are at GND potential at high frequencies. It is therefore possible to suppress the increase in insertion loss between the common input terminal IN and the first output terminal OUT1 (or the second output terminal OUT2).

The high resistance elements HR1 and HR2 are configured to have impurity concentration almost equal to that of the channel layers 12 as previously described. The high resistance elements HR1 and HR2 can provide high resistance with short distance, and it is therefore possible to suppress the increase in insertion loss without increasing the chip size. In other words, to obtain high resistance (5 KΩ or more) with only the low resistance element LR1 (LR2), it is necessary to make the width thereof small enough or secure enough length. Actually, fine patterning has a limit, and the desired resistance needs to be secured by setting proper length. However, a resistor of 5 KΩ or more cannot be laid within space on the route from the control terminal pad C1 to the corresponding crossing portion CR or from the control terminal pad C2 to the corresponding crossing portion CR. This requires preparation of particular space for placing the resistors of 5 KΩ or more, thus increasing the chip area. When the resistor of 5 KΩ or more is composed of the high resistance element HR1 or HR2 of this embodiment, the resistor of 5 KΩ or more can be laid within the space, thus eliminating the need to increase the chip size.

Moreover, in terms of the process, the high resistance elements HR1 and HR2 can be formed by only changing the mask pattern for formation of the channel layers 12.

Note that to implement the reverse control type logic without increasing the chip size, the first and second connecting paths CN1 and CN2 need to be extended and cross the pad wiring 130. This case requires a distance for the first and second connecting paths CN1 and CN2 to be extended, and the low resistance elements LR1 and LR2 may be connected as the resistors under the pad wiring 30.

Next, a description will be given of a second embodiment with reference to FIG. 4. The second embodiment employs HEMTs (High Electron Mobility Transistors) as first and second switching elements F1 and F2. Descriptions of parts thereof overlapping the first embodiment are omitted.

A circuit diagram and a plan view of the switching circuit device using HEMTs are the same as those of FIGS. 1 and 2A. FIGS. 4A to 4D show cross sectional views along lines a-a, b-b, d-d, and c-c of FIG. 2, respectively.

Figure 4A:
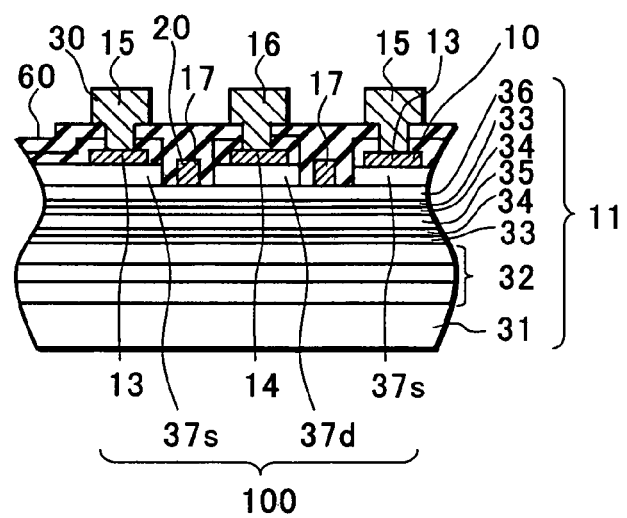
FIGS. 4A to 4D are cross-sectional views for explaining a second embodiment of the present invention.

As shown in FIG. 4A, a substrate 11 includes an undoped buffer layer 32 deposited on a semi-insulating GaAs substrate 31. On the buffer layer 32, an n+ type AlGaAs layer 33 as an electron supply layer, an undoped InGaAs layer 35 as a channel (electron transport) layer, and the n+ type AlGaAs layer 33 as an electron supply layer are sequentially grown. Between the electron supply layer 33 and the channel layer 35, a spacer layer 34 is disposed, respectively.

The buffer layer 32 is a high resistive layer with no impurity added. The thickness thereof is about several thousands Å. On the electron supply layer 33, an undoped AlGaAs layer as a barrier layer 36 is deposited to ensure predetermined breakdown voltage and pinch-off voltage. Furthermore, an n+ type GaAs layer as a cap layer 37 is deposited in the topmost layer. The cap layer 37 is added with a high concentration impurity, and the concentration of the impurity is about $1 \times 10^{18}$ to $5 \times 10^{18}$ cm$^{-3}$.

Each of the electron supply layer 33, the barrier layer 36, and the spacer layer 34 use a material having a band gap larger than that of the channel layer 35. In the electron supply layer 33, an n type impurity (for example, Si) is added to about $2 \times 10^{18}$ to $4 \times 10^{18}$ cm$^{-3}$.

With the above structure, electrons generated from the donor impurity of the n+ type AlGaAs layer as the electron supply layer 33 move to the channel layer 35 side to form a channel as a current path. The electrons and donor ions are therefore spatially separated by a heterojunction interface as a boundary. The electrons run in the channel layer 35 but are little affected by Coulomb scattering since the channel layer 35 does not include donor ions. Accordingly, the channel layer 35 can have high electron mobility.

An operating region 100 of each HEMT is isolated by an insulating region 50, which reaches the buffer layer 32. Hereinafter, the operating region 100 of each HEMT is a region of semiconductor layers which is isolated by the insulating region 50 and in which a first and a second source electrodes 13 and 15, a first and a second drain electrodes 14 and 16, and a gate electrode 17 of the HEMT are disposed. In other words, the operating region 100 is a region including all the semiconductor layers constituting the HEMT, such as the electron supply layer 33, the channel (electron transport) layer 35, the spacer layer 34, the barrier layer 36, and the cap layer 37.

The insulating region 50 is not completely electrically insulator and is insulated by implantation of impurity ions (B+) to provide a carrier trap in an epitaxial layer. In other words, the insulating region 50 also includes impurity as the epitaxial layer, but the impurity is inactivated by the implantation of B+ for insulation.

Specifically, the operating regions 100 of the HEMTs are isolated by forming the insulating regions 50 in outer peripheries of the respective operating regions 100 indicated by dot-dashed lines of FIG. 2A.

A part of the cap layer 37 in each operating region 100, to which the high concentration impurity is added, is removed to provide source regions 37s and drain regions 37d. The source and drain regions 37s and 37d are connected to the first source and the first drain electrodes 13 and 14 formed of an ohmic metal layer 10 as the first metal layer, respectively. In a layer above the ohmic metal layer 10, the second source and the second drain electrodes 15 and 16 are formed of the pad metal layer 30 as the third metal layer.

Parts of the cap layer 37 in the operating region 100 where the gate electrodes 17 are arranged are etched and removed to expose the undoped AlGaAs layer 36. The gate metal layer 20 as the second metal layer is Schottky connected to the undoped AlGaAs layer 36 to form the gate electrodes 17.

Each of peripheral impurity regions 150, which is not shown in FIG. 4A, is isolated by the insulating regions 50 into a predetermine shape. Each resistor is isolated by the insulating region 50 in the periphery thereof so as to ensure distance (length) and width providing a desired resistance.

A first connecting path CN1 includes a high resistance element HR1, a low resistance element LR1, and a resistor OR1 connected to a wiring M composed of the pad metal layer 30 and connects the gate electrodes 17 of the first FET group F1 and a first control terminal pad C1 (See FIG. 2A).

A second connecting path CN2 includes a high resistance element HR2, a low resistance element LR2, and a resistor OR2 connected to another wiring M composed of the pad metal layer 30 and connects the gate electrodes 17 of a second FET group F2 and a second control terminal pad C2 (See FIG. 2A).

The wiring M are extended on the substrate surface with nitride film 60 interposed therebetween, and the bottom of each wiring M is insulated by the insulating region 50.

Figures 4B, 4C:
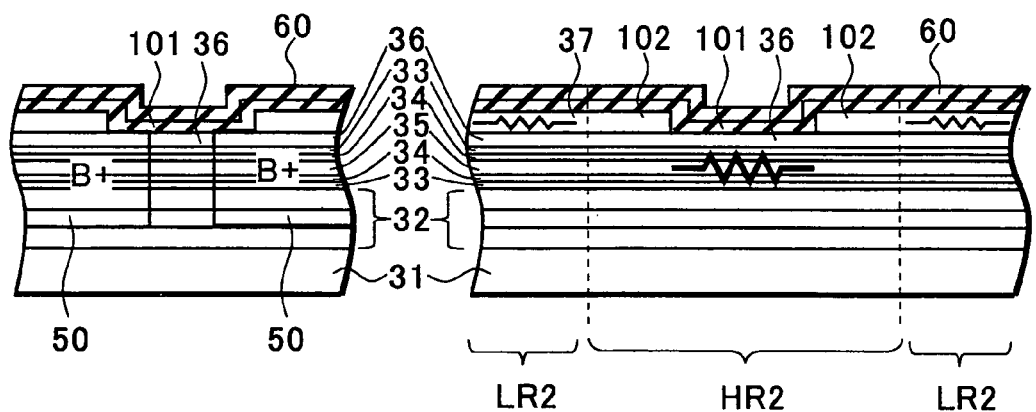

Herein, as shown in FIGS. 4B and 4C, the high resistance element HR1 (hereinafter, the same applies to HR2) of this embodiment is composed of the region where the cap layer 37 is removed to expose the semiconductor layer below the cap layer 37. Specifically, the high resistance element HR1 includes a recess portion 101 formed by etching the cap layer 37, and in each side of the recess portion 101, a part of the cap layer 37 serving as a contact portion 102 for connection remains. The contact portion 102 is a region continuously connected to the cap layer 37 of the low resistance element LR1 as shown in FIGS. 4B and 4C or a region in which a resistive element electrode (not shown) is provided for connection with one of the wirings M. When the resistive element electrode is provided, the resistive element electrode can be formed in a similar way to the source and drain electrodes by the ohmic metal layer 10 as the first metal layer and the pad metal layer 30 as the third metal layer of each HEMT.

When each of the contact portions 102 of the high resistance element HR1 is connected to the low resistance element LR1 as shown in FIG. 4C, the boundary therebetween is not clear, and, in this embodiment, the contact portion 102 is configured to be a minimum region (for example, about 3 μm long herein) necessary for the resistive element electrode to make a contact.

In the case of FIGS. 4B and 4C, the barrier layer 36 is exposed in the bottom of the recess portion 101. When the recess portion 101, in which the barrier layer 36 is exposed, is provided, the contact portion 102 and the channel layer 35 serve as a current path of the high resistance element HR1, and the channel layer 35 serves as a substantial resistive layer. Since the sheet resistance (for example, 400 Ω/□) of the channel layer 35 is several times as high as that of the cap layer 37, it is therefore possible to obtain the high resistance element HR1 having high resistance with short length. In this embodiment, the high resistance element HR1 having a sheet resistance Rs of about 400 Ω is formed by providing the recess portion 101. The length of the recess portion 101 is, for example, about 50 μm.

Figure 4D:
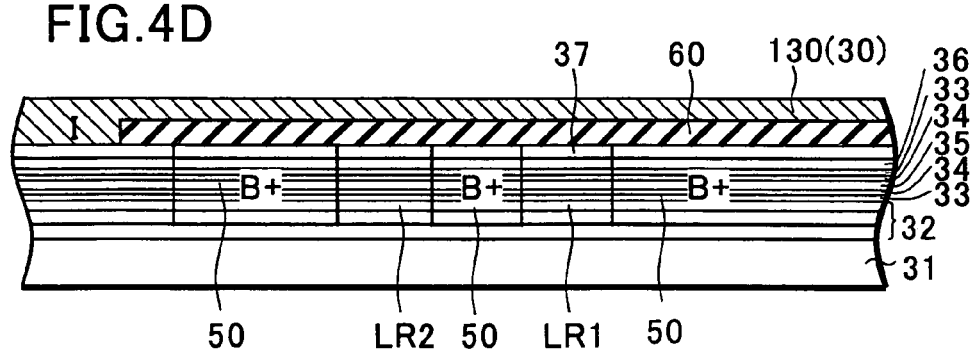

On the other hand, as shown in FIG. 4D, the low resistance element LR1 (hereinafter, the same applies to LR2) is isolated by the insulating region 50 so as to ensure necessary distance (length) and width. In the low resistance element LR1, the cap layer 37 remains. The cap layer 37 has high impurity concentration and large thickness and therefore serves as a main current path of the low resistance element LR1. Herein, the sheet resistance Rs of the low resistance element LR1 is set to about 100 Ω.

The resistors OR1 (hereinafter, the same applies to OR2) have a same structure as that of the high resistance element HR1 herein. However, the resistors OR1 are not limited to this and may be resistors same as the low resistance element LR1. In order to eliminate the leakage of the high frequency signal from the gate electrodes 17, the high frequency signal from the gate electrodes 17 should be attenuated early. The resistors OR1 are therefore desirably connected in the vicinity of the gate electrodes 17.

Parts of each of the first and second connecting paths CN1 and CN2 are disposed in parallel between a common input terminal pad I and the first and second FET groups F1 and F2. The first and second connecting paths CN1 and CN2 cross a pad wiring 130 with the nitride film 60 interposed therebetween in crossing portions CR (see FIG. 2A).

The first and second connecting paths CN1 and CN2 in the crossing portions CR are composed of the low resistance elements LR1 and LR2, respectively.

The high resistance element HR1 is connected between a first control terminal pad C1 and the corresponding crossing portion CR. The high resistance element HR2 is connected between a second control terminal pad C2 and the corresponding crossing portion CR. The high resistance elements HR1 and HR2 are connected near the first and second control terminal pads C1 and C2, respectively. This can ensure the attenuation of the high frequency signal leaking to the connecting paths CN1 and CN2 including the low resistance element LR1 (LR2), which is connected to the high resistance element HR1 (HR2) in series. Specifically, the high resistance element HR1 is therefore connected to a near point 100 μm or less from the control terminal pad C1. Even when another low resistance element or the pad wiring 130 exists as a component of the first connecting path CN1 between the high resistance element HR1 and the first control terminal pad C1, the distance thereof (distance from the high resistance element HR1 to the first control terminal pad C1) is shortened, thus resulting in less chance of leakage of the high frequency signal. Moreover, the high resistance element HR1 is short and can be disposed in the space between the first control terminal pad C1 and the adjacent common input terminal pad I. Accordingly, there is no need for particular space.

Accordingly, even when the high frequency analog signal leaks from the pad wiring 130 connecting the common input terminal pad I and the switching elements F1 and F2 through the nitride film 60 to the first connecting path CN1 (second connecting path CN2), the signal leaking is attenuated by the high resistance element HR1 (HR2) of about 5 KΩ or more. In other words, the leaking high frequency signal does not reach the first control terminal pad C1 (second control terminal pad C2). The high frequency signal from the common input terminal pad I does not reach the first control terminal pad C1 (second control terminal pad C2), which is at GND potential at high frequencies, so that the increase in insertion loss between a common input terminal IN and a first output terminal OUT1 (or a second output terminal OUT2) can be suppressed.

In order to obtain high resistance (5 KΩ or more) with only the low resistance element LR1 (LR2), it is necessary to make the width thereof small enough or secure enough length. Actually, the fine patterning has a limit, and the desired resistance needs to be secured by setting proper length. A large resistor cannot be laid within spaces between the electrode pads and other elements on the chip, and it is necessary to prepare particular space for disposing the resistor, thus increasing the chip area. Specifically, if the resistor of 5 KΩ or more is formed with only the low resistance element LR1 (LR2), the resistor cannot be laid within space on the route from the first control terminal pad C1 to the corresponding crossing portion CR or from the second control terminal pad C2 to the corresponding crossing portion CR. Accordingly, the resistor of 5 KΩ or more is composed of the high resistance element HR1 or HR2 as described in this embodiment. The resistor of 5 KΩ or more can be therefore laid within the space on the route from the first control terminal pad C1 to the corresponding crossing portion CR or from the second control terminal pad C2 to the corresponding crossing portion CR, thus eliminating the need to particularly increase the chip size.

Accordingly, this embodiment employs the high resistance element HR1 (HR2) in which the cap layer 37 is removed to cause the channel layer 35 with high sheet resistance to serve as a substantial resistive layer. The high resistance element HR1 (HR2) on the chip therefore occupy smaller area, and it is possible to attenuate the high frequency analog signal while suppressing the increase in chip area.

Figure 5:
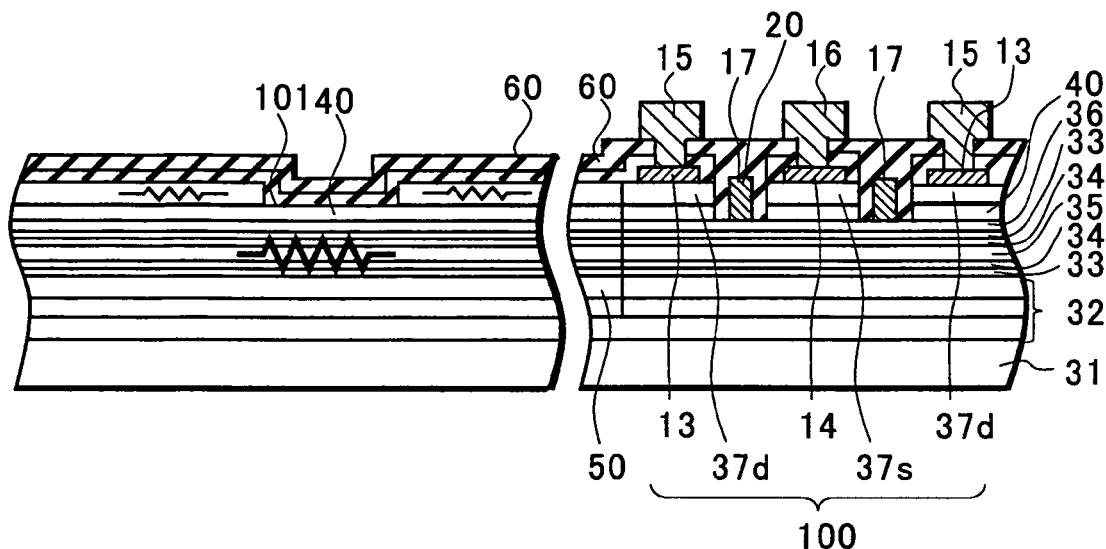
FIG. 5 is a cross-sectional view for explaining a third embodiment of the present invention.

FIG. 5 shows a third embodiment of the present invention. FIG. 5 shows partial cross-sectional views of the high resistance element HR1 (the same applies to HR2) and one of operating regions 100 taken along lines d-d and a-a of FIG. 2A, respectively.

The third embodiment has a structure in which an InGaP layer 40 is provided on a barrier layer 36 which is the same as the second embodiment and exposed in the bottom of a recess portion 101 of each high resistance element.

The barrier layer 36, which is an AlGaAs layer easily oxidized, is covered with the InGaP layer 40, which has a stable surface, so that it is possible to obtain more reliable resistors than those of the second embodiment.

When the recess portion 101 is formed, the GaAs cap layer 37 can be selectively etched easily at a very high selection ratio to the InGaP layer by wet etching. The recess portion 101 can be therefore formed at low cost and good reproducibility.

In this case, in each operating region 100, gate electrodes 17 are formed by removing the InGaP layer 40 to expose the barrier layer 36. At this time, the barrier layer 36 can be protected by the InGaP layer 40 just before evaporation of a gate metal layer 20, so that the characteristics of the HEMT can be improved.

Figure 6:
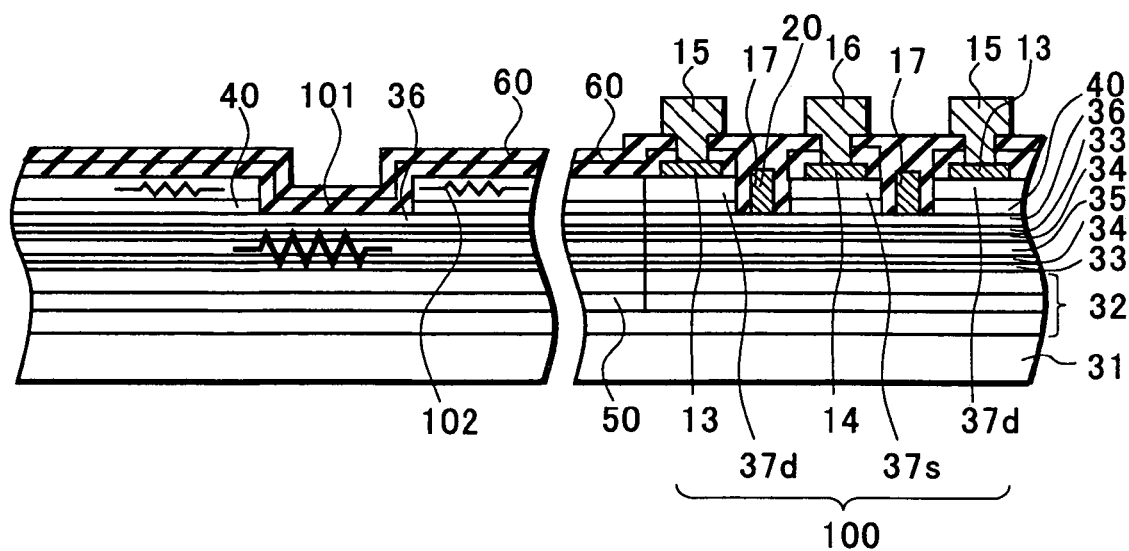
FIG. 6 is a cross-sectional view for explaining a fourth embodiment of the present invention.

FIG. 6 shows a fourth embodiment of the present invention. FIG. 6 shows partial cross-sectional views of the high resistance element HR1 (the same applies to HR1) and one of operating regions 100 taken along lines d-d and a-a of FIG. 2A, respectively.

The fourth embodiment has a structure in which an InGaP layer 40 is provided on a barrier layer 36 which is the same as the second embodiment and a high resistance element HR1 (HR2) includes a recess portion 101 formed by etching a cap layer 37 and the InGaP layer 40. The barrier layer 36 is exposed in the bottom of the recess portion 101.

The third embodiment also including the InGaP layer 40 has a problem of the sheet resistance slightly lower than that of the second embodiment since the InGaP layer with high concentration serves as the resistive layer in addition to a channel layer 35. On the other hand, in the fourth embodiment, the high concentration InGaP layer 40 is removed in the recess portion 101, and almost only the channel layer 35 substantially serves as the resistive layer, similar to the second embodiment. Accordingly, the sheet resistance in the fourth embodiment equals to that of the second embodiment, and the sheet resistance of this embodiment can be increased compared to that of the third embodiment. In other words, in the fourth embodiment, it is possible to obtain higher resistance with a same length and width as those of the third embodiment.

In this case, in each operating region 100, gate electrodes 17 are formed by removing the InGaP layer 40 to expose the barrier layer 36. The barrier layer 36 can be protected by the InGaP layer 40 just before evaporation of a gate metal layer 20, so that the characteristics of HEMTs can be improved.

Moreover, in terms of the epitaxial structure of the HEMTs, the second to the fourth embodiments can be applied with an epitaxial structure further including repetition of AlGaAs and GaAs layers or including an InGaP layer between the cap layer 37 and the barrier layer 36.

A description will be given of a fifth embodiment of the present invention with reference to FIGS. 7 to 8C.

Figure 7:
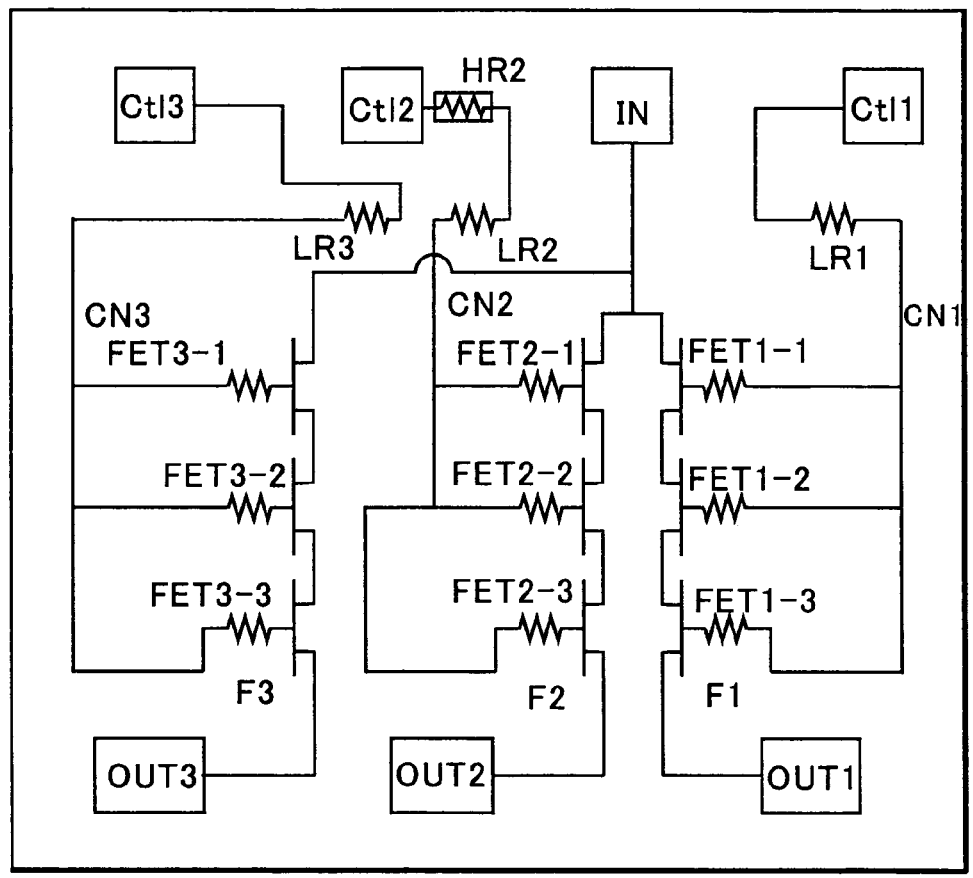
FIG. 7 is a cross-sectional view for explaining a fifth embodiment of the present invention.

FIG. 7 and FIGS. 8A to 8C show a single pole three throw (SP3T) including three switching elements. FIG. 7 is a circuit diagram showing an example of a switching MMIC of the fifth embodiment.

The switching MMIC includes first, second, and third FET groups F1, F2, and F3, each of which includes three FETs connected in series and serves as a switching element. A source electrode (or drain electrode) of the FET at an end of the first FET group F1, a source electrode (or drain electrode) of the FET at an end of the second FET group F2, and a source electrode (or drain electrode) of the FET at an end of the third FET group F3 are connected to a common input terminal IN. Gate electrodes of the three FETs of the first FET group F1 are connected through a first connecting path CN1 to a first control terminal Ctl1, three gate electrodes of a second FET group F2 are connected through a second connecting path CN2 to a second control terminal Ctl2, and three gate electrodes of a third FET group F3 are connected through a third connecting path CN3 to a third control terminal Ctl3.

Moreover, a drain electrode (or source electrode) of the FET at the other end of the first FET group F1 is connected to a first output terminal OUT1. A drain electrode (or source electrode) of the FET at the other end of the second FET group F2 is connected to a second output terminal OUT2. A drain electrode (or source electrode) of the FET at the other end of the third FET group F3 is connected to a third output terminal OUT3.

Control signals applied to the first, second, and third control terminals Ctl1, Ctl2, and Ctl3 are a combination of one H level signal and two L level signals. One of the FET groups to which the H level signal is applied is turned on and transmits a high frequency analog signal inputted in the common input terminal IN to any one of the output terminals. The first, second, and third connecting paths CN1, CN2, and CN3 individually include resistors. The resistors are disposed for the purpose of preventing the high frequency signal from leaking from the gate electrodes to DC potentials of the first, second, and third control terminals Ctl1, Ctl2, and Ctl3, which are AC grounded.

Figure 8A:
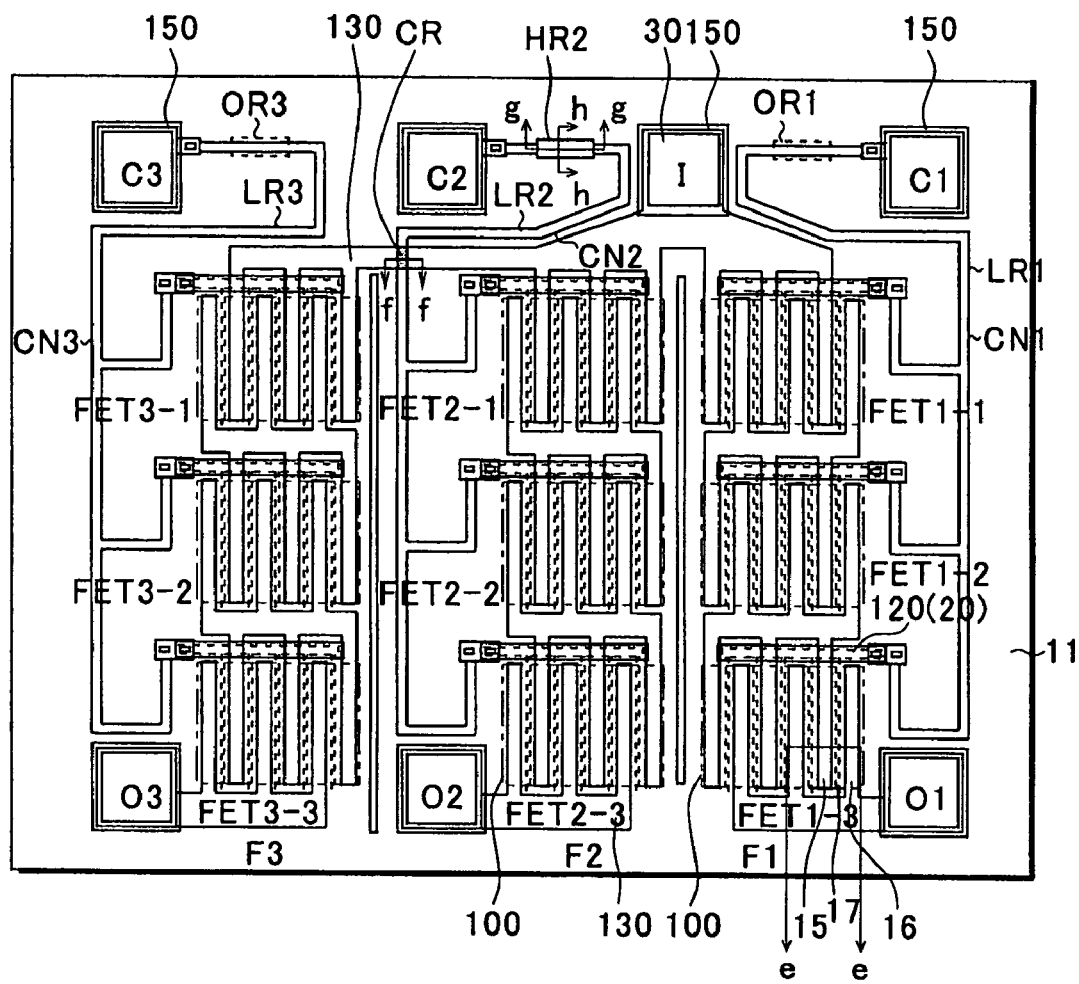
FIG. 8A is a plan view and 8B and 8C are cross-sectional views for explaining the preferred embodiment of the fifth invention, respectively.
Figure 8B:
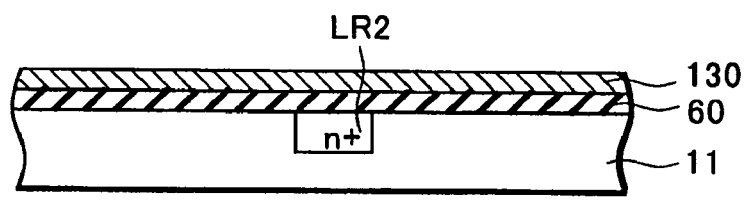
Figure 8C:
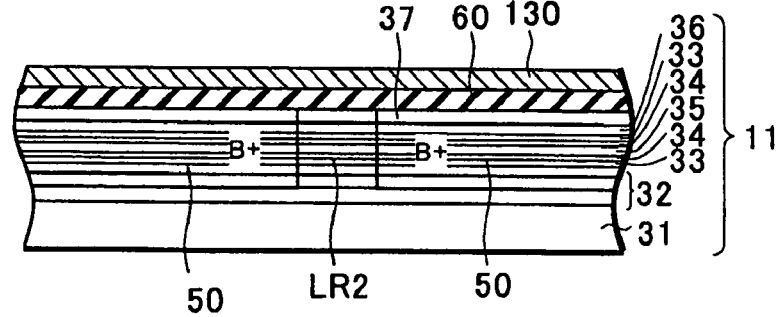
Figure 9A:
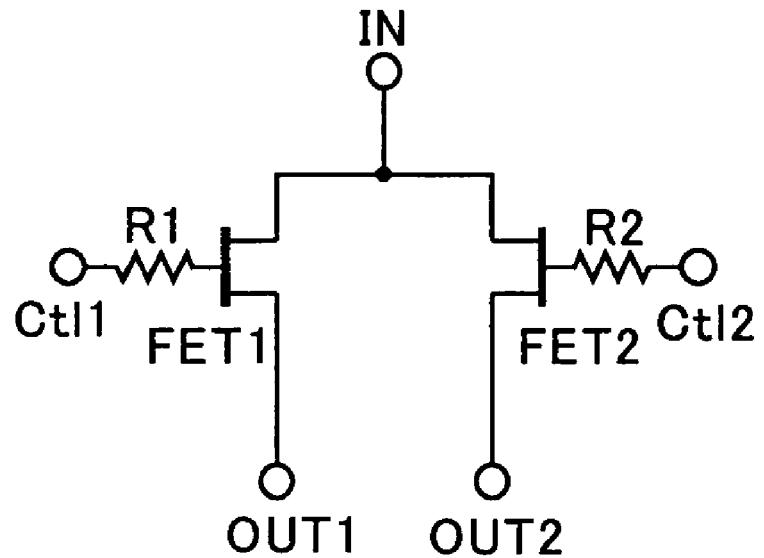
FIGS. 9A and 9B are circuit diagrams for explaining conventional arts.
Figure 9B:
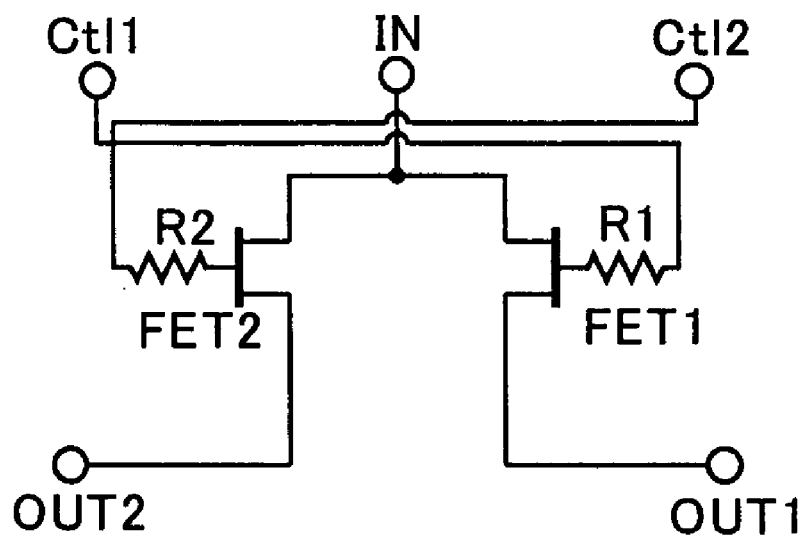

FIGS. 8A to 8C are views of a switching MMIC in which the circuit of FIG. 7 is integrated into a chip. FIG. 8A is a plan view, and FIGS. 8B and 8C are cross-sectional views along a line f-f of FIG. 8A.

In a GaAs substrate 11, three FET groups for switching are disposed. The first FET group F1 includes, for example, three FETs of FET1-1, FET1-2, and FET1-3 connected in series. The second FET group F2 includes, for example, FET2-1, FET2-2, and FET2-3 connected in series. The third FET group F3 includes, for example, FET3-1, FET3-2, and FET3-3 connected in series.

The nine gate electrodes constituting the FET groups are connected to the first, second, and third connecting paths CN1, CN2, and CN3. Electrode pads I, O1, O2, and O3, which are connected to the common input terminal IN and the first, second, and third output terminals OUT1, OUT2, and OUT3, respectively, and three electrode pads C1, C2, and C3, which are connected to the first, second, and third control terminals Ctl1, Ctl2, and Ctl3, respectively, are provided in the periphery of the substrate. In the periphery of each pad, a high concentration peripheral region 150 is disposed to increase the isolation.

Wirings of a second metal layer indicated by dotted lines are composed of a gate metal layer (for example, Pt/Mo) 20 simultaneously formed with the formation of the gate electrodes of each FET. Wirings of a third metal layer indicated by solid lines are composed of a pad metal layer (Ti/Pt/Au) 30 which connects the elements and forms the electrode pads. An ohmic metal layer (AuGe/Ni/Au) is a first metal layer and in an ohmic contact with the substrate 11. In FIG. 8A, the ohmic metal layer is overlapped by the pad metal layer 30 and is not shown.

The first, second, and third FET groups F1, F2, and F3 have a same structure, and a description is mainly given of the first FET group F1. In FET1-1, three comb teeth of the pad metal layer 30 extending from the upper side are second source electrodes 15 (or second drain electrodes 16). The second source electrodes 15 (or the second drain electrodes 16) are connected to the common input terminal pad I. Under the second source electrodes 15, first source electrodes formed of the ohmic metal layer are provided. Three comb teeth formed of the pad metal layer 30 extending from the lower side are the second drain electrodes 16 (or the source electrodes 15) of FET1-1. Under the second drain electrodes 16, drain electrodes formed of the ohmic metal layer are provided. The second source and drain electrodes 15 and 16 are arranged in a form of interdigitated comb teeth. Between a pair of adjacent second drain and source electrodes 15 and 16, each of five gate electrodes 17 formed of the gate metal layer 20 is arranged.

Operating regions 100 are formed by ion implantation, for example, in regions of the GaAs substrate 11 indicated by dot-dashed lines. Alternatively, the operating regions 100 are formed in the regions indicated by the dot-dashed lines by stacking a plurality of semiconductor layers on the GaAs substrate and isolating the semiconductor layers by insulating region 50.

In FET1-2, three second source electrodes 15 (or the second drain electrodes 16) extending from the upper side are connected to the second drain electrodes 16 of FET1-1. Herein, these electrodes are just passing points of the high frequency signal and are generally not required to be led to the outside. Accordingly, pads are not provided. Three second drain electrodes 16 (or the second source electrodes 15) extending from the lower side are connected to the second source electrodes 15 of FET1-3. These electrodes are also just passing points of the high frequency signal and are generally not required to be led to the outside. Accordingly, pads are not provided. Under the second source and drain electrodes 15 and 16, the ohmic metal layer is provided. The second source and drain electrodes 15 and 16 are arranged in a form of interdigitated comb teeth. The five gate electrodes 17 formed of the gate metal layer 20 are arranged in the form of comb teeth, and each of the gate electrodes 17 is arranged between an adjacent pair of the second drain and source electrodes 16 and 15. When the FET groups are off, the switching circuit device including a plurality of FETs connected in series is able to withstand voltage amplitude larger than a single-stage switching circuit device and is used as a high power circuit device. At that time, the source or drain electrodes at which FETs are connected to each other in series are not required to be led to the outside, and pads are unnecessary.

In FET1-3, three comb teeth of the pad metal layer 30 extending from the upper side are the second source electrodes 15 (or the second drain electrodes 16). Under the second source electrodes 15, first source electrodes formed of the ohmic metal layer are provided. Three comb teeth of the pad metal layer 30 extending from the lower side are the second drain electrodes 16 (or the second source electrodes 15) which are connected to the output terminal pad O1. Under the second drain electrodes 16 (or the second source electrodes 15), first drain electrodes (first source electrodes) formed of the ohmic metal layer are provided. The second source and drain electrodes 15 and 16 are arranged in a form of interdigitated comb teeth. The five gate electrodes 17 of the gate metal layer 20 are arranged in the form of comb teeth, each gate electrode 17 being arranged between a pair of the second source and drain electrodes 15 and 16.

The cross-sectional view along a line e-e is the same as FIG. 2B in the case of FET with the operating region 100 formed by ion implantation and is the same as FIG. 4B in the case of HEMT.

The gate electrodes 17 of each FET of the first FET group F1 are joined outside the operating region 100 by a gate wiring 120 formed of the gate metal layer 20 and connected to the first control terminal pad C1 by the first connecting path CN1.

The first connecting path CN1 is composed of a low resistance element LR1 but may include a resistor OR1 of a high resistance element of 5 KΩ or more connected in series 100 μm or less from the first control terminal pad C1. In this case, even when high frequency signal leaks to the first connecting path CN1 through the substrate 11 from pad wirings 130 (wires or electrodes), operating regions, and the like in which the high frequency signal is transmitted, the leaking signal can be attenuated by the high resistance element OR1. The leaking signal can be therefore prevented from reaching the first control terminal pad C1, which is at GND potential at high frequencies. In other words, the increase in insertion loss can be suppressed. The same applies to the third connecting path CN3.

FIGS. 8B and 8C are cross-sectional views of a crossing portion CR. FIG. 8B shows a case of FET of which operating region has been formed by ion implantation and FIG. 8C shows a case of HEMT.

As shown in FIG. 8A, the second connecting path CN2 is composed of a low resistance element LR2 and partially includes a high resistance element HR2 connected in series. The second connecting path CN2 crosses the pad wiring 130, which connects the common input terminal pad I and the third FET group F3, with nitride film 60 interposed therebetween in the crossing portion CR indicated by hatching. The second connecting path CN2 at the crossing portion CR is composed of the low resistance element LR2.

The high resistance element HR2 is connected between the second control terminal pad C2 and the crossing portion CR of the second connecting path CN2. Moreover, the high resistance element HR2 is connected in series on the route of the second connecting path CN2. The high resistance element HR2 is connected 100 μm or less from the second control terminal pad C2.

This can ensure the attenuation of the high frequency signal leaking to the connecting path units such as the low resistance element LR2 connected to the high resistance element HR2 in series.

The cross-sectional view of the high resistance element HR2 along a line h-h of FIG. 8A is the same as FIG. 3A or 4B. Specifically, In the case of the FET with the operating region 100 formed by ion implantation (FIG. 3A), the high resistance element HR2 is formed to have a resistance of 5 kΩ or more by doping ions of the impurity same as that forming a channel layer 12 into the GaAs substrate 11 to obtain peak concentration equal to that of the channel layer 12.

In the case of the HEMT (FIG. 4B), the high resistance element HR2 is isolated in the periphery thereof by the insulating region 50, and a cap layer 37 is etched to be formed to have a resistance of 5 kΩ or more. In the case of the HEMT, the cross-sectional view along a line g-g of FIG. 8A is the same as FIG. 4C. As shown in FIG. 4C, in a recess portion 101, the semiconductor layer under the cap layer 37 is exposed, and the semiconductor layers under the cap layer 37 serve as the resistive layer. Accordingly, the high resistance element HR2 can have the resistance increased even with short length.

In the case of the HEMT, structures of the substrate and the high resistance element HR2 may be the same as those of the third or fourth embodiment.

In the preferred embodiments, when one connecting path crosses the pad wiring, the high resistance element only should be connected between the control terminal pad to which the connecting path is connected and the crossing portion CR near the control terminal pad. In other words, the layout of the other resistor connected to the connecting path is not limited to the aforementioned embodiments. For example, according to the resistance necessary for the switching MMIC, another resistor may be connected as a part of the wiring M constituting the connecting path.

Figure 10:
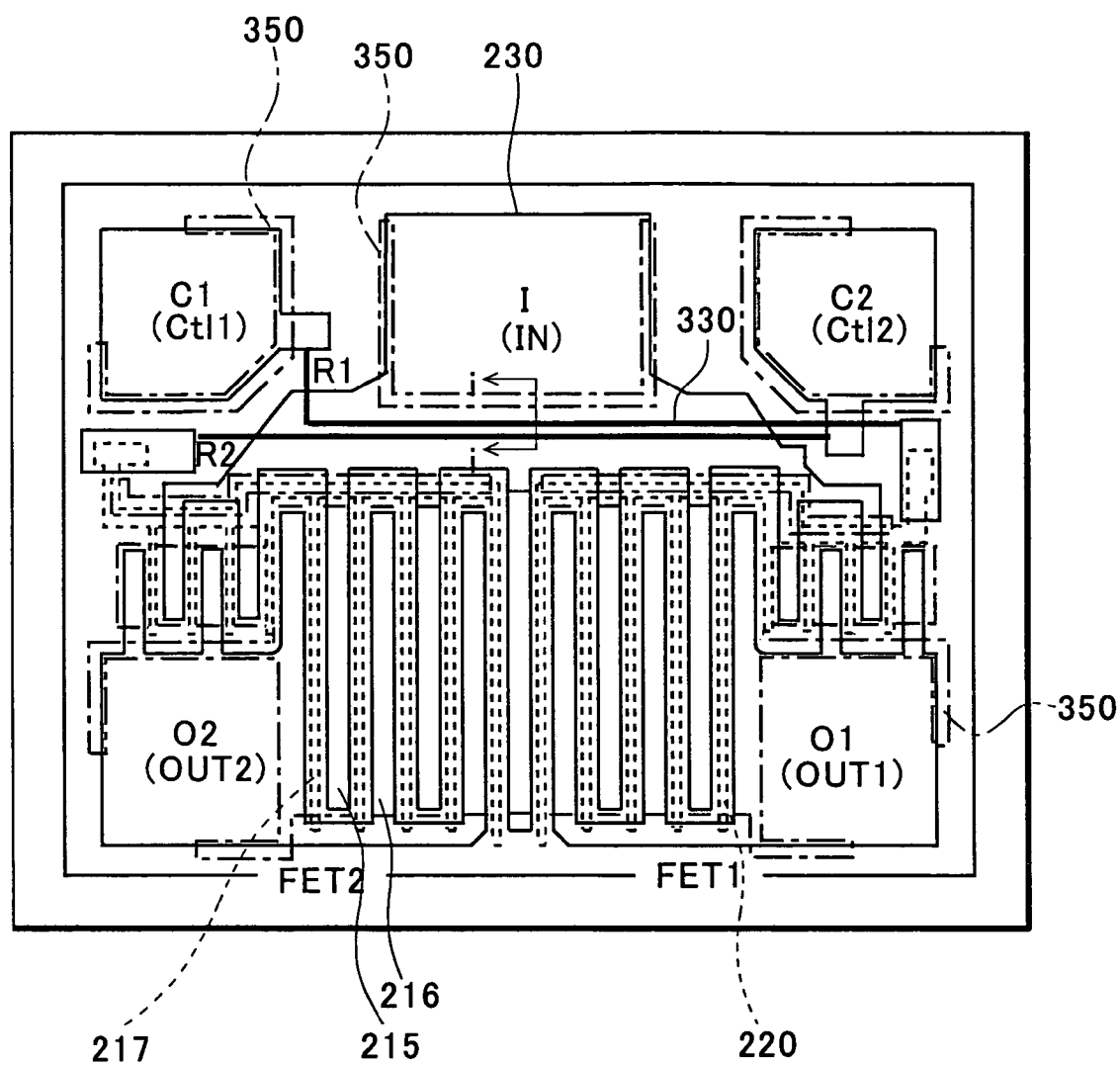
FIG. 10 is a plan view for explaining the conventional arts.
Figure 11:
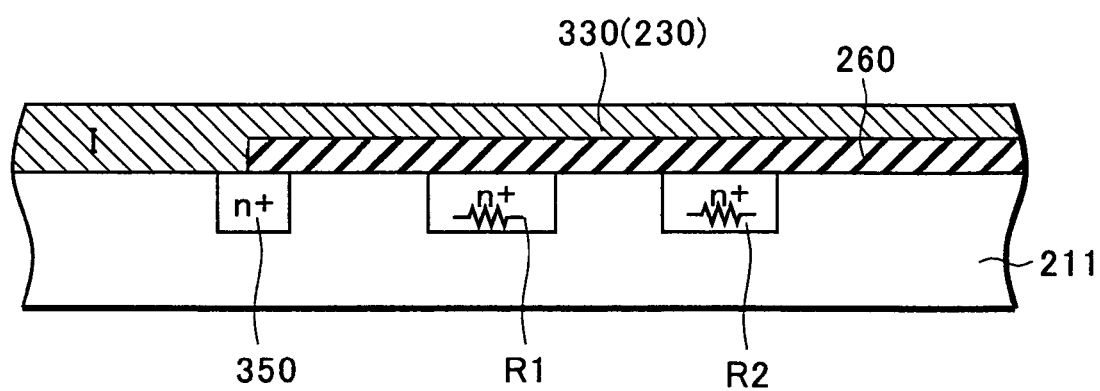
FIG. 11 is a cross-sectional view for explaining the conventional arts.

Each multi-stage switching element may include four or more FETs connected in series. Moreover, the preferred embodiments can be implemented when the switching element is a single FET constructing an SPDT as shown in FIG. 10.

The high resistance elements HR1 and HR2 (HR3) does not need to be the impurity doped region or the region where the cap layer 37 is etched to expose the semiconductor layer thereunder and may be, for example, a metal resistor formed of evaporated NiCr or the like.

According to the preferred embodiments of the invention, the following effects can be obtained.

First, even when the high frequency signal transmitted in the common input terminal pad I leaks through the nitride film to the first and second connecting paths, the leaking signal is attenuated by the high resistance element of 5 KΩ or more. This eliminates the high frequency signal actually reaching the first and second control terminal pads. In other words, since the high frequency analog signal does not leak to the control terminals, the increase in insertion loss between the common input terminal and output terminals can be suppressed.

Second, the high resistance elements are connected near the first and second control terminal pads. This can ensure the attenuation of the high frequency signal leaking to the connecting paths including the low resistance elements connected to the respective high resistance elements in series. As described above, most of the leakage of the high frequency signal is the leakage from the crossing portions in which the wire crosses the connecting paths. However, in fact, the high frequency signal also leaks a little through the substrate from the pad wirings 130, electrodes, operating regions 100, and the like in which the high frequency signal is transmitted. For example, when a high frequency signal with high power of several watts is transmitted, the leakage component thereof cannot be ignored. Specifically, in the case where one of the high resistance elements is connected to a point far from the first or second control terminal pad and, for example, the low resistance element or a pad wiring is connected as a component of the connecting path between the high resistance element and the first or second control terminal pad, the high frequency signal leaks to the low resistance element through the substrate from the pad wirings 130, electrodes, operating regions 100, and the like in which the high frequency signal is transmitted. The leaking high frequency signal is not attenuated and reaches the first or second control terminal pad.

As shown in the embodiments, therefore, the high resistance element is connected to a near point 100 µm or less from the first control terminal pad (the same applies to the second control terminal pad). Even when there is a low resistance element to which the high frequency signal leaks, the length of the low resistance element (distance from the high resistance element to the first control terminal pad C1) is made short, thus resulting in less chance of leakage of the high frequency signals.

Moreover, each high resistance element is short and can be disposed in a space between the first or second control terminal pad and the adjacent common input terminal pad, so that the high resistance element does not require a particular space.

Third, in the case of the FET with the channel layer formed by ion implantation, the high resistance element is an impurity doped region and can be formed of a predetermined region by only modification of the pattern. In the reverse control type switching circuit device, it is necessary to extend the connecting paths connecting the respective control terminals and gates of the FETs. However, in a region requiring a certain degree of distance for the extension, the low resistance element formed of a region doped with high concentration impurity should be used.

Moreover, in this case, the high resistance elements can be formed in the same process as the channel layers of the operating regions, and the low resistance elements can be formed in the same process as the source or drain regions of the operating regions. It is therefore possible to implement the embodiments by only modification of the ion implantation pattern.

Fourth, in the case of the HEMT, each high resistance element is a region in which the recess portion is provided by removing the cap layer to expose the semiconductor layer under the cap layer. Specifically, the recess portion can be formed simultaneously in an alignment mark formation process to remove the cap layer. In other words, the high resistance element can be therefore formed without particularly adding a new process. Each high resistance element has a sheet resistance several times as high as that of the cap layer, which has high impurity concentration, and can provide a same resistance with shorter length than the case where the resistive layer includes the cap layer. Accordingly, the distance that each resistor extends in the chip can be shortened, and the increase in chip area can be suppressed in the case where the high resistance elements are connected.

Fifth, the InGaP layer is provided on the barrier layer. Accordingly, the InGaP layer can be used as an etch stop layer, and the stability of the process can be enhanced.

Sixth, the InGaP layer having a stable surface is provided on the barrier layer and is exposed in the bottom of the recess portion. Accordingly, the channel layer thereunder can be surely protected, and the reliability can be increased.

Seventh, the cap layer is removed so as to expose the barrier layer in the bottom of the recess portion. This can ensure the formation of the high resistance elements.

In the case where the InGaP layer used as the etch stop layer, which is on the barrier layer, is doped with an impurity, this InGaP layer is also removed to expose the barrier layer in the bottom of the recess portion, thus further increasing the sheet resistance of the resistance elements.

What is claimed is:

1. A compound semiconductor switching circuit device comprising:
   two or more switching elements formed on a compound semiconductor substrate, each of the switching elements comprising at least one gate, a signal input portion and a signal output portion;
   a common input terminal pad formed on the substrate and connected with the signal input portions of the switching elements;
   an output terminal pad provided for each of the switching elements and connected with a corresponding signal output portion, the output terminal pads being formed on the substrate;
   a control terminal pad provided for each of the switching elements and connected with a corresponding gate, the control terminal pads being formed on the substrate;
   a connection wiring formed on the substrate and connecting the common input terminal pad and one of the signal input portions; and
   a connecting path connecting one of the control terminal pads and a corresponding gate,
   wherein the connecting path intersects the connection wiring and comprises a high resistance element that has a resistance higher than an average resistance of the connecting path and is disposed between the control terminal pad with which the connecting path is connected and the intersection between the connecting path and the connection wiring.

2. The compound semiconductor switching circuit device of claim 1, further comprising another connecting path connecting one of the control terminal pads and a corresponding gate, wherein the another connecting path intersects the connection wiring and comprises a high resistance element that has a resistance higher than the average resistance of the connecting path and is disposed between the control terminal pad with which the another connecting path is connected and the intersection between the another connecting path and the connection wiring.

3. The compound semiconductor switching circuit device of claim 1, wherein the high resistance element is disposed within 100 μm from the control terminal pad.

4. The compound semiconductor switching circuit device of claim 1, wherein each of the switching elements comprises a filed effect transistor comprising a channel layer comprising a first doped impurity region formed in the substrate, and the high resistance element comprises a second doped impurity region formed in the substrate that has an impurity concentration equal to an impurity concentration of the first doped region.

5. The compound semiconductor switching circuit device of claim 1, wherein each of the switching elements comprises an HEMT comprising a stack of a buffer layer, an electron supply layer, a channel layer, a barrier layer and a cap layer, and the high resistance element comprises a portion of the stack that does not include the cap layer.

6. The compound semiconductor switching circuit device of claim 5, wherein a sheet resistance of the high resistance element is higher than a sheet resistance of the cap layer.

7. The compound semiconductor switching circuit device of claim 5, wherein the upper most layer of the high resistance element is the barrier layer.

8. The compound semiconductor switching circuit device of claim 5, wherein an InGaP layer is disposed on the barrier layer, and the InGaP layer is the upper most layer of the high resistance element.

9. The compound semiconductor switching circuit device of claim 1, wherein the high resistance element has a resistance higher than 5 KΩ.

10. The compound semiconductor switching circuit device of claim 1, wherein the connection wiring comprises a pad metal layer that is comprised of the common input terminal pad, and an insulating film is disposed between the pad metal layer and the connecting path at the intersection between the connection wiring and the connecting path.

11. The compound semiconductor switching circuit device of claim 10, wherein the connecting path under the pad metal layer comprises a low resistance element having a sheet resistance lower than the high resistance element.

12. The compound semiconductor switching circuit device of claim 1, wherein the connection wiring is configured to transmit a high frequency analog signal.

13. A compound semiconductor switching circuit device comprising:
   a first switching element and a second switching element that are formed on a compound semiconductor substrate, each of the first and second switching elements comprising at least one gate, a signal input portion and a signal output portion;
   a common input terminal pad formed on the substrate and connected with the signal input portions of the switching elements;
   a first output terminal pad formed on the substrate and connected with the signal output portion of the first switching element;
   a second output terminal pad formed on the substrate and connected with the signal output portion of the second switching element;
   a first control terminal pad formed on the substrate and connected with the gate of the first switching element;
   a second control terminal pad formed on the substrate and connected with the gate of the second switching element;
   a connection wiring formed on the substrate and connecting the common input terminal pad and the signal input portions of the first and second switching elements;
   a first connecting path connecting the first control terminal pad and the gate of the first switching element; and
   a second connecting path connecting the second control terminal pad and the gate of the second switching element;
   wherein each of the first and second connecting paths intersects the connection wiring and comprises a high resistance element that has a sheet resistance higher than a sheet resistance of a corresponding connecting path located at the intersection between the connection wiring and the first and second connecting paths and is disposed between a corresponding control terminal pad and the intersection between the connection wiring and the first and second connecting paths.

* * * * *